United States Patent [19]
Allen

[11] Patent Number: 5,272,478
[45] Date of Patent: Dec. 21, 1993

[54] METHOD AND APPARATUS FOR ENTROPY CODING

[75] Inventor: James D. Allen, Castro Valley, Calif.

[73] Assignee: Ricoh Corporation, Menlo Park, Calif.

[21] Appl. No.: 931,156

[22] Filed: Aug. 17, 1992

[51] Int. Cl.$^5$ ............................................. H03M 7/30
[52] U.S. Cl. ....................................... 341/107; 341/51
[58] Field of Search ................... 341/51, 107, 87, 106

[56] References Cited

U.S. PATENT DOCUMENTS

| | | | |
|---|---|---|---|
| 4,286,256 | 8/1981 | Langdon, Jr. et al. | 341/107 |
| 4,467,317 | 8/1984 | Langdon, Jr. et al. | 341/107 |
| 4,891,643 | 1/1990 | Mitchell et al. | 341/107 |
| 4,933,883 | 6/1990 | Pennebaker et al. | 341/107 |
| 5,045,852 | 9/1991 | Mitchell et al. | 341/51 |
| 5,059,976 | 10/1991 | Ono et al. | 341/107 |

OTHER PUBLICATIONS

Howard, Paul G. and Vitter, Jeffrey Scott; "Practical Implementations of Arithmetic Coding"; *Image and Text Compression;* Ed. James A. Storer; Kluwer Academic Publishers (Boston); 1992; pp. 85-112.

Langdon, Glen G. Jr.; "An Introduction to Arithmetic Coding"; Mar. 1984; pp. 135-149.

Pennebacker, W. B. et al.; "An Overview of the Basic Principles of the Q-Coder Adaptive Binary Arithmetic Coder"; Nov. 1988; pp. 717-735.

*Primary Examiner*—Howard L. Williams
*Attorney, Agent, or Firm*—Blakely, Sokoloff, Taylor & Zafman

[57] ABSTRACT

The present invention provides an encoding and decoding apparatus used for the compression and expansion of data. A state machine is provided having a plurality of states. Each state has at least one transition pair. Each element of the transition pair comprises zero or more bits representative of the compact code to be output and the identification of the next state to proceed to. The transition pair reflects an output for a yes and no response associated with the probability of the data to be compacted and whether the data falls within that probability.

19 Claims, 10 Drawing Sheets

FIG _ 1A
| SYMBOL | PROBABILITY | RANGE |
|---|---|---|
| Z | 0.2 | (0, 0.2) |
| Y | 0.3 | (0.2, 0.5) |
| X | 0.1 | (0.5, 0.6) |
| W | 0.2 | (0.6, 0.8) |
| V | 0.1 | (0.8, 0.9) |
| U | 0.1 | (0.9, 1.0) |
FIG _ 1B
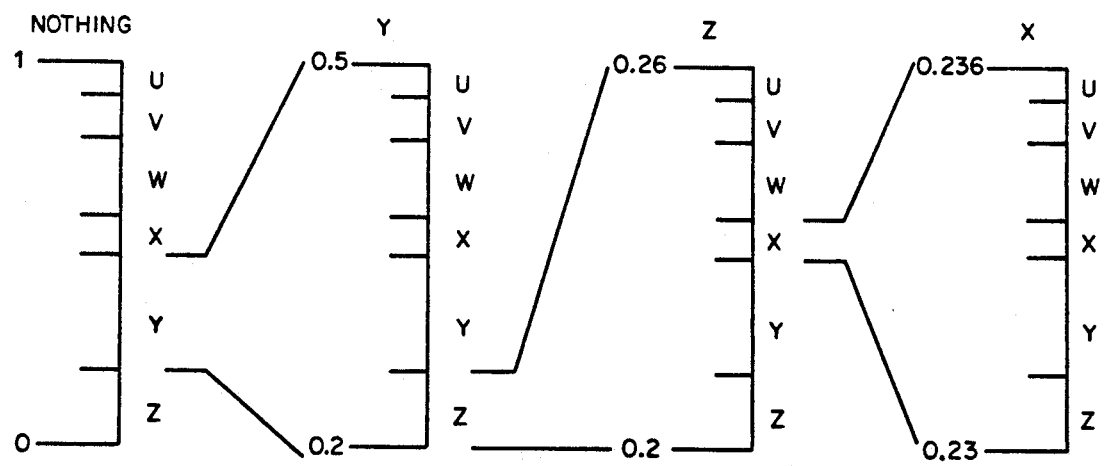

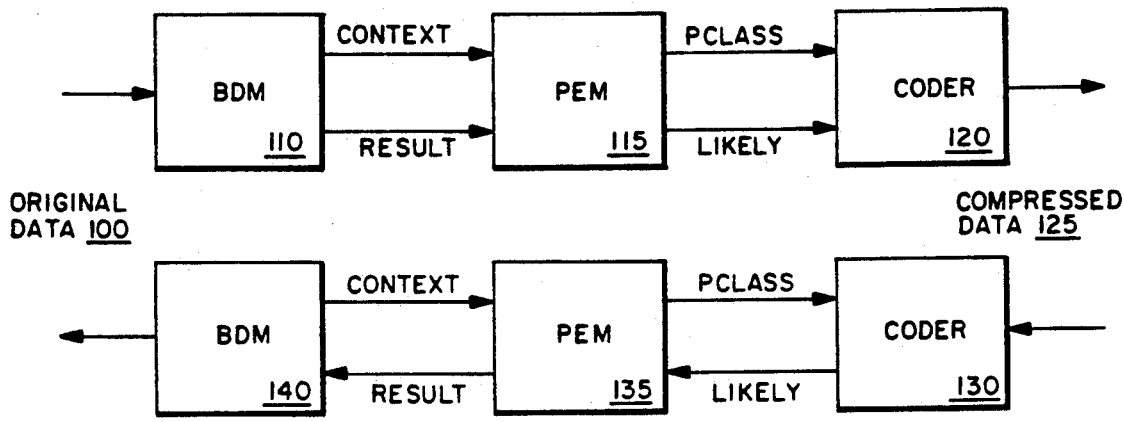
FIG_2
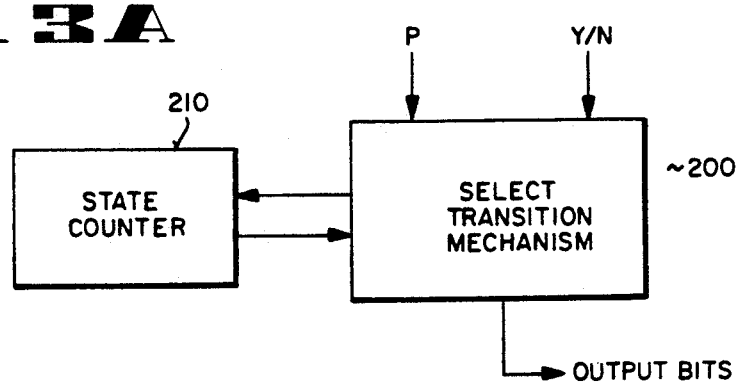
FIG_3A
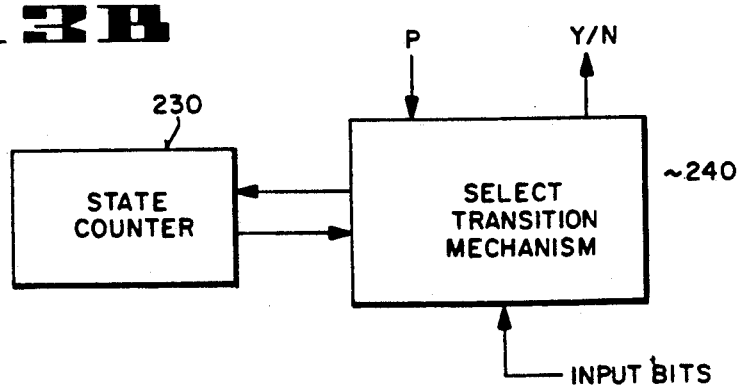
FIG_3B

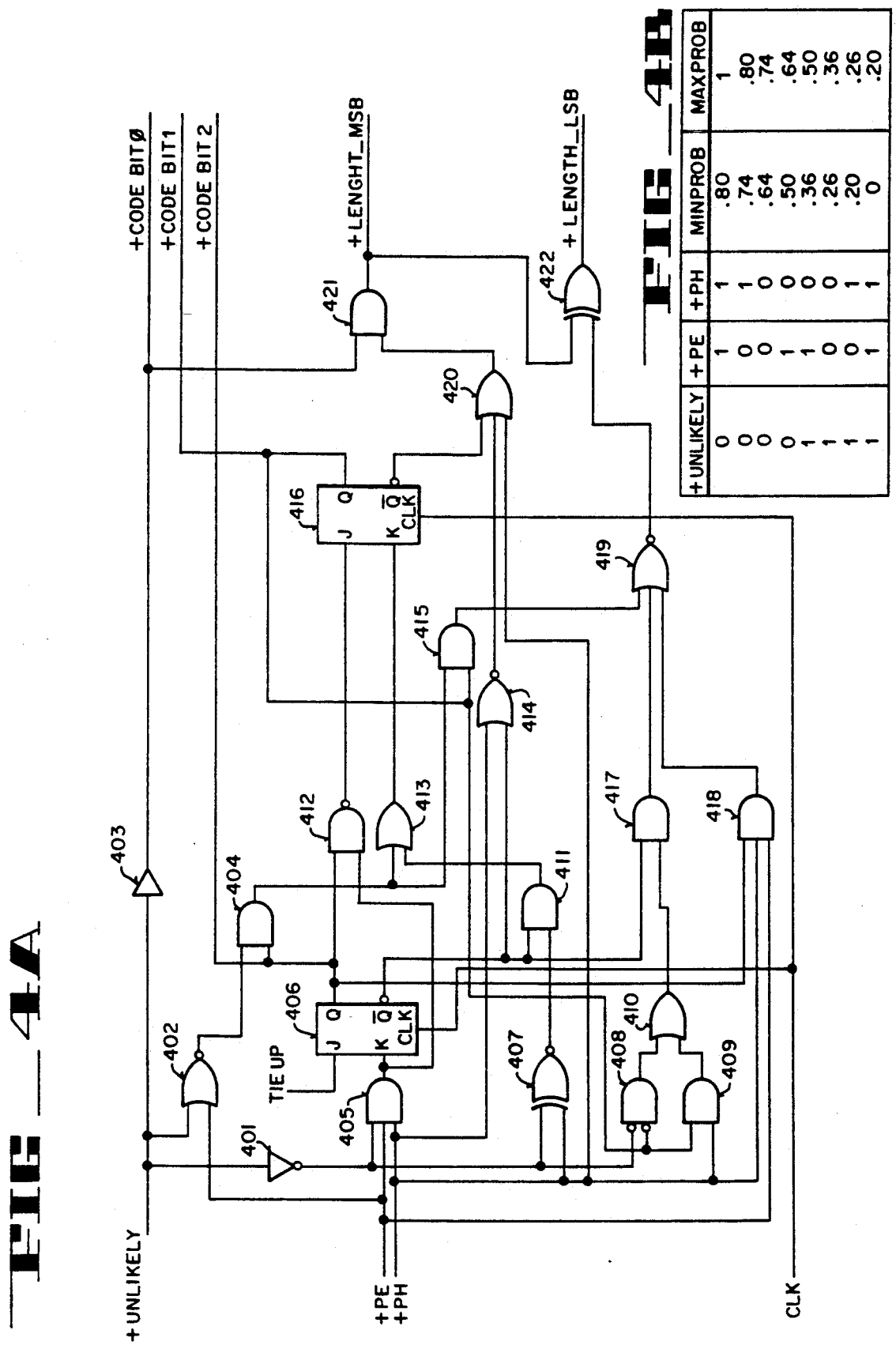

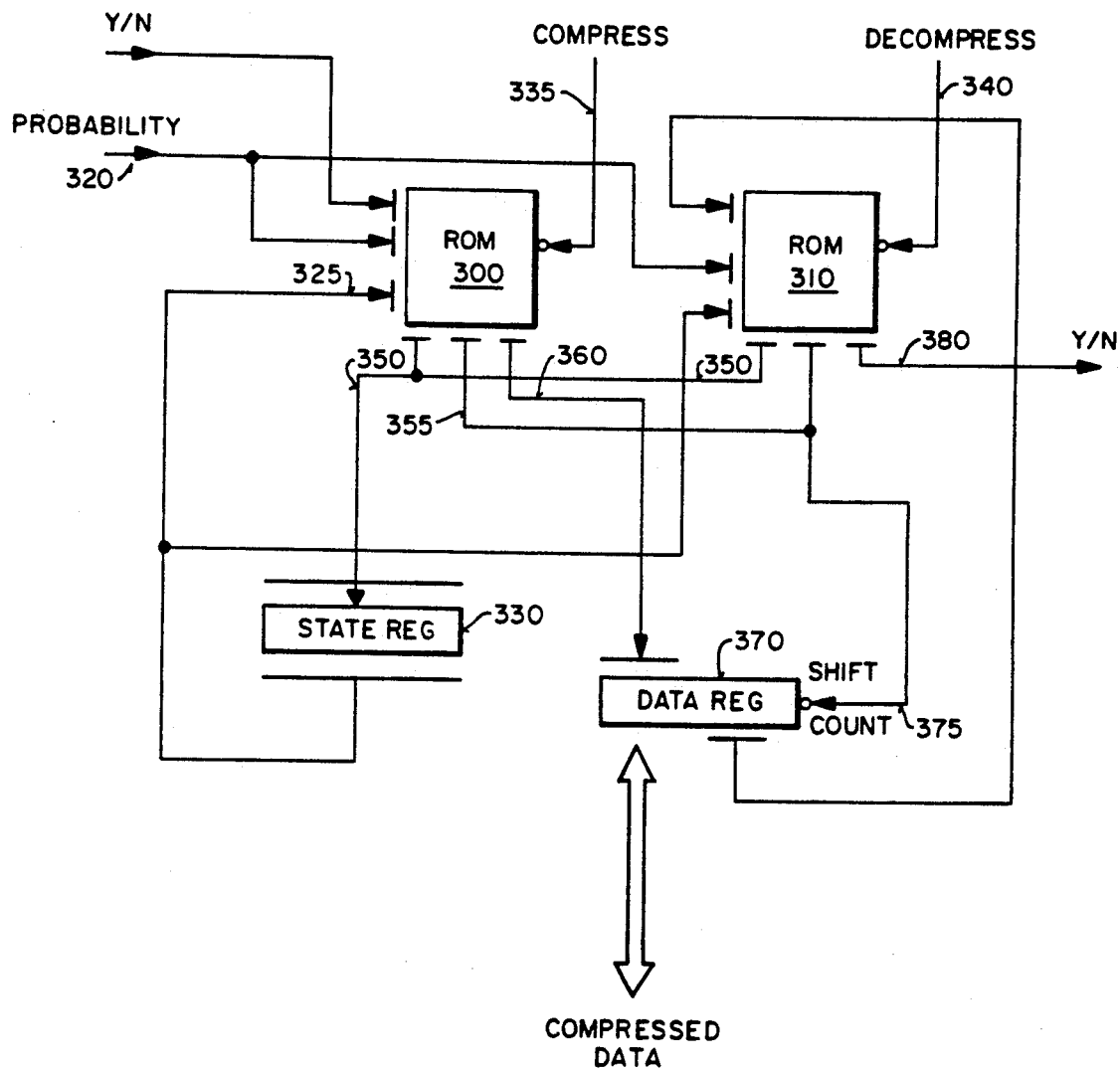

FIG_6
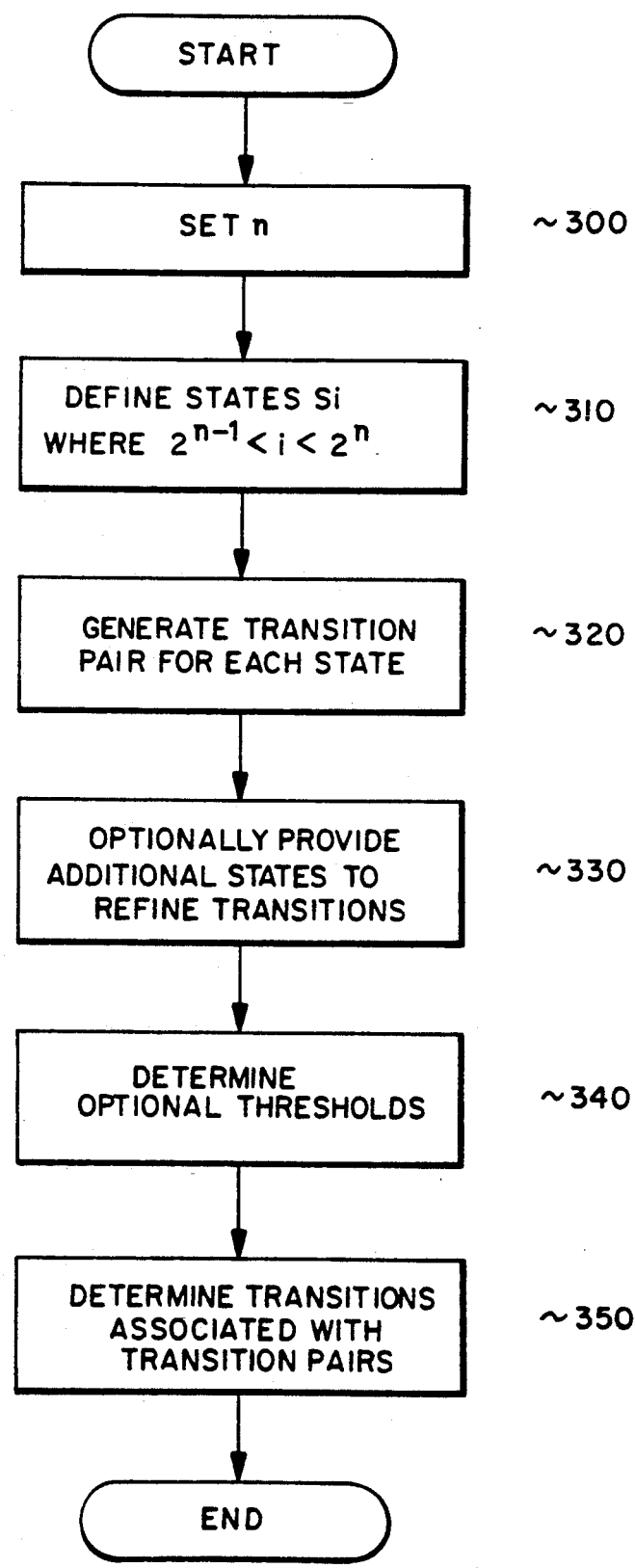

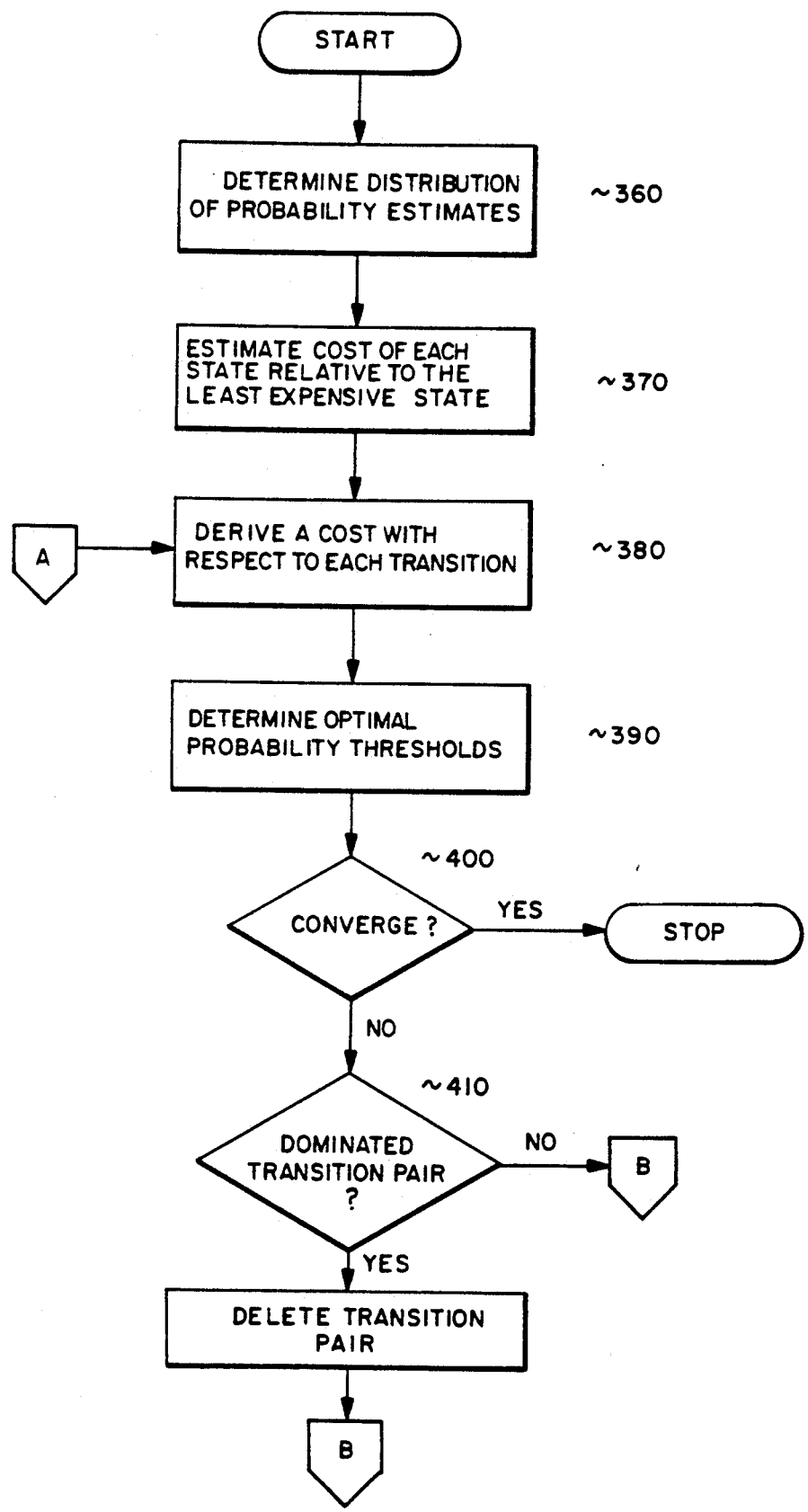
FIG _ 7A

FIG_7B
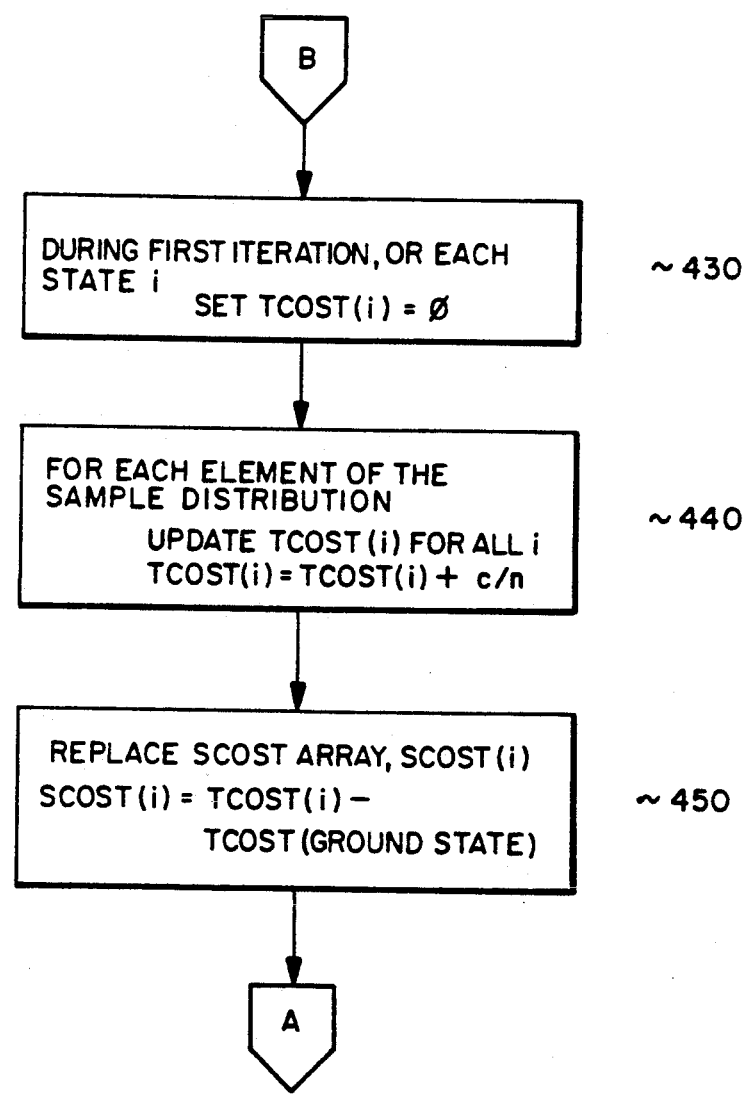

FIG _ 8A  TRANSITION MACHINE TRANSITION DIAGRAM

| TWO-STATE MACHINE | | | |
|---|---|---|---|
| | STATE | TRANSITIONS | |
| | | (1) | (2) |
| N | S4 | 11 | 1 |
| Y | | S3 | 0 |
| THRESHOLD | | 0.644 | |
| N | S3 | 10 | |
| Y | | 0 | |

FIG _ 8B  TRANSITION MACHINE TRANSITION DIAGRAM

| FOUR-STATE MACHINE | | | | |
|---|---|---|---|---|
| STATE | TRANSITIONS | | | |
| | (1) | (2) | (3) | (4) |
| S8 | 111 | 11 | | 1 |
| | S7 | S6 | | 0 |
| | 0.811 | 0.642 | | |
| S7 | 110 | | 1, S6 | |
| | S6 | | 0 | |
| | 0.736 | | | |
| S6 | 101 | 10 | | |
| | S5 | 0 | | |
| | 0.796 | | | |
| S5 | 100 | | | |
| | 0 | | | |

FIG _ 8C  EXAMPLE MACHINE 3A

| SIX-STATE MACHINE | | | | | | | | |
|---|---|---|---|---|---|---|---|---|
| STATE | TRANSITIONS | | | | | | | |
| | (1) | (2) | (3) | (4) | (5) | (6) | (7) | (8) |
| S16 | 1111 | 111 | 11 | | | | | 1 |
| | S15 | S14 | S12 | | | | | 0 |
| | 0.895 | 0.823 | 0.637 | | | | | |
| S15 | 1110 | | 11, S12 | | | | 1, S14 | |
| | S14 | | S12 | | | | 0 | |
| | 0.880 | | 0.681 | | | | | |
| S14 | | | 110 | | | | 1, S12 | |
| | | | S12 | | | | 0 | |
| | | | 0.734 | | | | | |
| S12 | 1011 | 101 | | 10 | | | | |
| | S11 | S10 | | 0 | | | | |
| | 0.849 | 0.805 | | | | | | |
| S11 | 1010 | | 10, S12 | | | | | |
| | S10 | | 0 | | | | | |
| | 0.867 | | | | | | | |
| S10 | | 100 | | | | | | |
| | | 0 | | | | | | |

FIG _ 8D

| STATE | 0.93 | 0.89 | 0.85 | 0.80 | 0.71 | 0.67 | 0.58 | 0.5 |
|---|---|---|---|---|---|---|---|---|
| S32 | s31<br>11111 | s28<br>111 | s28<br>111 | s26<br>11,*s24 | s24<br>11 | s24<br>11 | s20<br>1,*s24 | 0<br>1 |
| S31 | s31<br>11110 | s28<br>111,s24 | s28<br>111,s24 | s24<br>11,s28 | s24<br>11,s28 | s24<br>11,s28 | 0<br>1,s30 | 0<br>1,s30 |
| S30 | s28<br>1110 | s28<br>1110 | s24<br>11,s24 | s24<br>11,s24 | s24<br>11,s24 | s24<br>11,s24 | 0<br>1,s28 | 0<br>1,s28 |
| S28 | s26<br>1101 | s26<br>1101 | s24<br>110 | s24<br>110 | s22<br>1,*b12 | 0<br>1,s12 | 0<br>1,s24 | 0<br>1,s24 |
| S26 | s24<br>1100,s20 | s24<br>1100,s20 | s24<br>1100,s20 | s20<br>1,*b12 | s20<br>1,*b12 | 0<br>1 | 0<br>1 | 0,s24<br>1 |
| S24 | s23<br>10111 | s22<br>1011 | s20<br>101 | s20<br>101 | 0<br>10 | 0<br>10 | 0<br>10 | 0,s24<br>*b12 |
| S23 | s22<br>10110 | s20<br>101,s24 | s20<br>101,s24 | s20<br>101,s24 | 0<br>10,s28 | 0<br>10,s28 | 0<br>10,s28 | 0<br>10,s28 |
| S22 | s20<br>1010 | s20<br>1010 | s20<br>1010 | 0<br>10,s24 | 0<br>10,s24 | 0<br>10,s24 | 0<br>10,s24 | 0,s24<br>b10 |
| S20 | 0<br>100 | 0<br>100 | 0<br>100 | 0<br>100 | 0<br>100 | 0<br>100 | b12<br>00 | b12<br>00 |
| B12 | *b10<br>0100 | *b10<br>0100 | *b10<br>0100 | 01<br>100 | 01<br>100 | 01<br>100 | 01<br>100 | 01<br>100 |
| B10 | 10,s24<br>011 | 10,s24<br>011 | 10,s24<br>011 | 10,s24<br>011 | 10,s24<br>011 | 10,s24<br>011 | 10,s24<br>011 | 10,s24<br>011 |

FIG_8E

| SIXTEEN-STATE MACHINE | | | | | | | | |
|---|---|---|---|---|---|---|---|---|
| STATE | TRANSITIONS | | | | | | | |
| | (1) | (2) | (3) | (4) | (5) | (6) | (7) | (8) |
| S16 | 1111<br>S15<br>0.911 | 111<br>S14<br>0.839 | 11,*S12<br>S13<br>0.787 | 11<br>S12<br>0.692 | 1,*10<br>S11<br>0.666 | 1,*S12<br>S10<br>0.580 | | 1<br>0 |
| S15 | 1110<br>S14<br>0.875 | | 11,S12<br>S12<br>0.716 | | 1,B10<br>B10<br>0.634 | | 1,S14<br>0 | |
| S14 | 1101<br>S13<br>0.898 | 110<br>S12<br>0.798 | 1,*A6<br>S11<br>0.758 | 10<br>B10<br>0.663 | | 1,S12<br>0 | | |
| S13 | 1100<br>S12<br>0.850 | | 1,A6<br>S10<br>0.715 | | 1,S10<br>0 | | | |
| S12 | 1011<br>S11<br>0.880 | 101<br>S10<br>0.766 | | 10<br>0<br>0.561 | | *A6<br>0,S12 | | |
| S11 | 1010<br>S10<br>0.838 | | 10,S12<br>0<br>0.614 | | A5<br>0, | | | |
| S10 | 1001<br>S9<br>0.876 | 100<br>0<br>0.714 | *B3<br>0,S14<br>0.658 | 00<br>A6 | | | | |
| B10 | 1101<br>B9<br>0.876 | 110<br>0 | | 00<br>B6<br>0.663 | | | | |
| S9 | 1000<br>0<br>0.779 | | B3<br>0,S12 | | | | | |
| B9 | 1100<br>0<br>0.779 | | A3<br>0,S12 | | | | | |
| A6 | 0100<br>*A5<br>0.801 | 100<br>01<br>0.538 | *B3<br>01,S12 | | | | | |
| B6 | | 110<br>01 | | | | | | |
| A5 | 1010<br>A4<br>0.759 | 011<br>10,S12 | | | | | | |
| A4 | 1001<br>B3<br>0.671 | 100<br>011 | | | | | | |
| A3 | 1100<br>011 | | | | | | | |
| B3 | 1000<br>011 | | | | | | | |

METHOD AND APPARATUS FOR ENTROPY CODING

FIELD OF THE INVENTION

The present invention relates to the field of data compression; particularly, the present invention relates to the field of entropy coding.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to transmit the image. Many different data compression techniques exist in the prior art.

Every compression system is associated with a corresponding decompression system. The implementation of a decompression system can normally be inferred from the compression system. The algorithm used by the compression system to effectuate encoding must be either transmitted as part of the compressed document or inferable by the decompression system.

More specifically, in entropy coding, a sequence of "input" symbols $<t_1, t_2, t_3 \ldots, t_m>$, which are typically data samples or quantized error values, can be replaced deterministically with a sequence of "output" codewords $<s_1, s_2, s_3, \ldots, s_n>$ as a function of time:

$$f(\bar{t}) = (\bar{s}) = <s_1, s_2, \ldots s_n>$$

such that a deterministic inverse (reconstruction) function exists:

$$f^{-1}(\bar{s}) = (\bar{t}), \text{ for all } \{t\}, \{s\} = f(\{t\})$$

This type of entropy code f may be built from a set of instantaneous production rules. The result of applying each of these rules is the generation of an ordered sequence of zero or more output tokens. However, the number of output tokens is usually one or more.

In some compression systems, an input file or set of data is translated into a sequence of decisions under the direction of a decision model. Each decision has an associated likelihood, and based on this likelihood, an output code is generated and appended to the compressed file. To implement these encoding systems, the compression systems have three parts: a decision model, a probability estimation method and a bit-stream generator. The decision model receives the input data and translates the data into a set of decisions which the compression system uses to encode the data. The probability estimation method is the procedure for developing the estimate for the likelihood of each decision. The bit-stream generator performs the final bit-stream encoding to generate the output code that is the compressed data set or compressed file.

Compression can effectively occur in either or both the decision model and the probability estimation method. For example, in Lempel-Ziv encoding, which is often used for text compression, the decision model is rather complicated and removes much redundancy. On the other hand, the probability estimation method and the bit-stream generator are usually trivial, where, for example, if 512 decision results are possible, each is assumed equally likely and the output bit pattern is always exactly nine bits in length. In contrast, a simple Huffman coder uses a trivial decision model with the compression being derived from the probability estimation method "knowing" the usual frequencies of the letters in text files and generating bit output appropriately. Similarly, redundancy can be reduced dramatically from digital time signals using Karhunen-Loeve type transforms or even simple substraction as utilized in differential pulse code modulation. However, in these situations, the probability estimation method and bit-stream generator are necessary in order to realize redundancy reduction. For more information on Lempel-Ziv, Huffman, and Karhunen-Loeve, see Thomas Lynch, *Data Compression Techniques and Applications*, (1985 Van Nostrand Reinhold) and Mark Nelson, *The Data Compression Book* (1992 M & T Publishing, Inc.)

In other methods, such as CCITT facsimile transmission, redundancy is reduced initially using a simple predictive method like exclusive-oring a line with the previous line. Then, a decision model replaces each line with a sequence of all-black or all-white run lengths. Afterwards, further compression can be achieved by subjecting the result to a Huffman-like code using default probability estimates.

One compression technique widely employed is arithmetic coding. Arithmetic coding maps a string of data (i.e., a "message") to a code string in such a way that the original message can be recovered from the code string wherein the encoding and decoding algorithms perform arithmetic operations on the code string. For a discussion on arithmetic coding see, Glenn G. Langdon, Jr., "An Introduction to Arithmetic Coding", *IBM Journal of Research and Development*, vol. 28, No. 2, (March 1984).

In arithmetic coding, the code representative of a message is represented by an interval of numbers between 0 and 1. As the number of symbols in the message increases, the interval representing it becomes smaller and the number of bits needed to specify that interval increases. Initially, the interval for the message is between zero and one [0,1). As each symbol of the message is processed, the interval is narrowed in accordance with the symbol probability.

For example, referring to FIG. 1a, the symbols (in this instance, text) z, y, x, w, v, u are assigned the probabilities 0.2, 0.3, 0.1, 0.2, 0.1, 0.1. The probabilities are then mapped to the range of [0, 1.0) resulting in the ranges identified in FIG. 1a. Referring to FIG. 1a, the symbol z is allocated the range [0, 0.2) reflecting the probability of 0.2 and the symbol u is allocated the range of [0.9, 1.0) reflecting the high end of the probability range of symbols and the u probability of 0.1.

In order for compression to be possible, the symbols which occur more frequently are assigned a greater probability value. Once the probability ranges are allocated, the symbols may be encoded for compression. The initial range or interval is set to [0,1). After the occurrence of the first symbol of the message to be compressed, the range is narrowed in proportion to that symbol's probability. Referring to FIG. 1a, the range [0,1) is first illustrated. After the occurrence of the symbol y, the range is decreased to a new interval of size proportional to the probability of y. In other words, instead of the range or interval being set to its initial values, the range is set according to the probability of the symbol which just occurred. Since the probability of y is 0.3 and has a range of [0.2, 0.5), the updated range from which the encoding occurs is [0.2, 0.5), such that the probability of occurrence of the next symbol includes the influence of the probabilities of the symbols which came before it (i.e., y). Thus, all of the probabilities for the symbols total a range from 0.2 to 0.5 instead of 0 to 1 as before the occurrence of the symbol y. Similarly, after the occurrence of the next symbol z, which has the probability of 0.2 and the range [0, 0.2) the interval is decreased in proportion to the z probability to [0.2, 0.26), such that the range of probabilities for the next symbol is taken from the interval 0.2 to 0.26, with the influence of both the previous y and z symbols taken into account.

In decoding, since the size of the interval used in the encoding process is indicative of the probability range of a symbol in group of symbols, the symbols can be easily extracted, using the ranges for each symbol that were utilized in encoding. For example, if the final interval was [0.23, 0.236), one can determine that the first symbol is y because the final interval lies completely within the range of y [0.2, 0.5). Using the same process as the encoder, after seeing y, the initial interval [0,1) is updated to be [0.2, 0.5) and the updated range of a [0.2, 0.26) encompasses the final interval [0.23, 0.236). This process continues until all symbols are decoded.

A binary arithmetic coder is one type of an arithmetic coding system. In a binary arithmetic coding system, the selection of a symbol from a set of symbols can be encoded as a sequence of binary decisions. An example of a binary arithmetic coder is the "Q-coder" developed at International Business Machines, Armonk, N.Y. The Q-coder utilizes fixed precision arithmetic and a renormalization process wherein the code string and interval are renormalized as necessary in order to maintain the values within the bounds allowed by fixed-precision representation. In addition, to avoid the need to perform a multiplication operation to scale the interval to reflect the coding of a symbol, an approximation is utilized in place of the multiplication. For information regarding the Q-coder, see: W. B. Pennebaker, J. L. Mitchell, G. G. Langdon, F., Jr., R. B. Arps, "An Overview of the Basic Principles of the Q-Coder Adaptive binary Arithmetic Coder", IBM Journal of Research and Development, vol. 32, No. Nov. 6, 1988, pp. 717–726; J. L. Mitchell, W. B. Pennebaker, "Optimal Hardware and Software Arithmetic Coding Procedures for the Q-Coder", IBM, Journal of Research and Development, vol. 32, No. Nov. 6, 1988, pp. 727– 736; W. B. Pennebaker, J. L. Mitchell, "Probability Estimation for the Q-Coder", IBM Journal of Research and Development, vol. 32, No. Nov. 6, 1988, pp. 753-774. For further discussion of data compression, see: Timothy C. Bell, John G. Cleary, Ian H. Whitten, *Text Compression* (1990 Prentice Hall Inc.); and Anil K. Jain, *Fundamentals of Digital Image Processing*, (1989 Prentice Hall, Inc.).

As will be shown, the present invention uses a decision model which produces decisions which are always two-valued (i.e., yes or no). The present invention also employs output tokens which are not fixed-length bit strings. In particular, the present invention encodes most decisions with less than one bit.

SUMMARY OF THE INVENTION

It is an object of the present invention to provide a binary coder that is efficient and simple to implement.

The present invention provides a simple, inexpensive encoding and decoding apparatus and method for the compression and expansion of data which is represented by binary decisions. The present invention includes a state machine having a plurality of states. Each state has at least one transition pair. Each element of the transition pair causes zero or more bits representative of the code to be output and the identification of the next state to which to proceed. The transition pair reflects an output for a yes and no response associated with the probability of the data to be compacted and whether the data falls within that probability.

The present invention also includes an apparatus and method for searching the transition pairs in the current state of the state machine according to the probability value. According to the probability estimate, the present invention outputs zero or more bits and transitions to the next state.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1a and 1b illustrate the prior art method of arithmetic coding.

FIG. 2 is an exemplary block diagram of an encoder and decoder of a preferred embodiment of the present invention.

FIG. 3a and 3b are simple block diagrams of the coder and decoder of the present invention.

FIG. 4a is a logic diagram of a coder of an embodiment of the present invention and FIG. 4b is a table identifying the probability ranges corresponding to the input values.

FIG. 5 is a block diagram representation of another embodiment of the present invention.

FIG. 6 is a flow chart illustrative of a process to develop a transition matrix utilized in the preferred embodiment of the present invention.

FIG. 7a and 7b are flow charts illustrative of the process to develop the threshold values and optimization of the same in the transition matrix in the preferred embodiment of the present invention.

FIG. 8a, 8b, 8c, 8d and 8e are examples of transition matrices employed in the system of the present invention.

DETAILED DESCRIPTION OF THE INVENTION

A method and means for coding binary decisions is described. In the following description, numerous specific details are set forth, such as specific numbers of bits, tokens, etc., in order to provide a thorough understanding of the preferred embodiment of the present invention. It will be obvious to one skilled in the art that the present invention may be practiced without these specific details. Also, well known circuits have been shown in block diagram form, rather than in detail, in order to avoid unnecessarily obscuring the present invention.

FIG. 2 is a block diagram illustration of a system for the compression and decompression of data utilized by the present invention. Data 100 is input into the binary decision model (BDM) 110. BDM 110 translates the input data stream (e.g., an input file) into a set or sequence of binary decisions. It should be noted that the data model used by the present invention expresses all events as binary decisions. In the currently preferred embodiment, every binary decision is phrased so that it is likely at least 50 percent of the time. This ensures that all probability classes used by the coder of the present invention are probabilities greater than or equal to 50 percent. BDM 110 also provides a context for each binary decision.

Both the sequence of binary decisions and their associated context are output from BDM 110 to probability estimation module (PEM) 115. PEM 115 utilizes the context to generate a probability estimate for each binary decision. The actual probability estimate is represented by a class, referred to as PClass. Each PClass is used for a range of probabilities. PEM 115 also determines whether the binary decision (result) is or is not in its more probable state. Both the probability estimate (PClass) and the determination of whether the binary decision was likely or not produced by PEM 115 are output to coder 120. After passing the PClass to coder 120, PEM 115 can update its probability estimate for the given context.

Coder 120 is coupled to receive inputs of the probability class regarding the probability of occurrence of the input binary decisions and a bit indicating whether or not the probable event occurred. In response, coder 120 produces a compressed data stream representing the original data 100. Coder 120 outputs zero or more bits with each input. This compressed data may be transmitted across a network or other data link (e.g., communications line) or simply stored in memory. For example, the compressed data 125 may be utilized to transmit images between facsimile machines.

The reverse process is executed to decompress the data, such that the original input data 100 may be reconstructed (to some extent). Note that the result from PEM 135 is exactly the same as the result given to PEM 115. The original data 100 can be reconstructed exactly or approximately depending on BDM 110 and 140. Decoder (codec) 130 is coupled to receive the compressed output 125. BDM 140 provides a context to PEM 135. PEM 135 is coupled to receive the context from BDM 140. Based on the context, PEM 135 provides a probability class to coder 130. Coder 130 is coupled to receive the probability class from PEM 135. In response to the probability class, coder 130 outputs a bit representing whether the binary decision is in its probable state. In other words, coder 130 returns a bit indication, the occurrence of the likely event. PEM 135 is coupled to receive the bit from coder 130 and uses the bit to update the probability estimates based on the received bit. PEM 135 also returns the result to BDM 140. BDM 140 is coupled to receive the returned bit and uses the returned bit to generate the original data 100 and update the context for the next binary decision.

In FIG. 2, the BDM and PEM for both the encoder 120 and decoder 130 provide a means and a method for understanding the data and for developing useful probability estimates. It should be noted that many approaches exist to provide probability estimation and the present invention is not restricted to using any particular probability estimation mechanism. For example, in image compression, the probability could be determined according to a 5-pel prediction method wherein five previously processed pixel values ("X") are used to estimate another pixel value, A, as shown below.

XX
XXXA

This can be accomplished by maintaining 32 probability estimates (i.e., $2^5$ where 5 is the number of previous pixels) and selecting the appropriate estimate based on the actual "context" (i.e., the five previous processed pixel values). The individual probability estimates may be updated whenever their individual context is encountered. In one embodiment, the estimates are updated every decision. In the preferred embodiment, the bit-stream generator is combined with the probability estimation machine into a single table lookup. The only requirement of the present invention is that the input to the bit generator is a binary decision and a probability. In other words, the input to the encoder must be only decision pairs (e.g., yes/no decisions) or any other substitute two code arrangement.

In implementing this specific restriction, where all possible decisions occur in pairs, both decisions have probabilities associated with them. For instance, in the case of yes/no decisions, a "yes" has a probability P, while a "no" has a probability $(1-P)$. These probabilities are usually stored and accessed in a table. In practice, the size of the estimation table may be cut in half by remembering solely the more probable state of each context. In other words, the pair (P, X), where X is "yes" or "no" and P is a probability between 0 and 1, may be replaced with the pair (P', W) where W is "likely" or "unlikely" and P' is between 0.5 and 1. This is the approach taken in the currently preferred embodiment of the coder of the present invention where the probability estimates received from the PEM 115 and PEM 135 by coder 120 and decoder 130 respectively represent probability estimates for the most probable state (i.e., probabilities greater than 50 percent). It should be noted that for the purposes of the following discussion the terms likely and unlikely will be used interchangeably with the "yes" (Y) and "no" (N) designations.

The binary entropy coding system of the present invention comprises a transition machine having multiple states, where each of the states has one or more pairs of legal transitions. Each transition is defined to cause a string of zero or more bits to be emitted when the transition occurs and a destination state to which the transition machine transfers during transition. It is from this destination state that the transition machine continues processing of the next symbol. In the present invention, PEM 115 determines which transition pair in any particular state is taken. In the currently preferred embodiment, PEM 115 (or 135) determines the selection of one of the pairs of legal transitions from the current state by outputting probability estimates to coder 120 (or decoder 130). The Y/N input from BDM 110 determines which of the two legal transitions of the selected pair is made during encoding. Ultimately, coder 120 outputs its bit stream which represents the compressed input data according to the Y/N input from the BDM and the probability estimates from PEM 115. During decoding, the bit values in the bit stream of the compressed bit stream determine which of the two legal transitions from the selected pair is made.

Each of the states can be described as a set of legally emittable bit streams. With the emitted bits properly prepended, each of the transitions of the machine can also be described as such a set. For each transition pair employed in the coder and decoder, the transition pairs are disjoint and have a union equal to the set corresponding to the state. In the present invention, the union of the set is all possible binary outputs. The probability range associated with each transition pair is chosen to produce a low bit rate encoding of the binary decisions.

Coder 120 receives the probability associated with the symbol to be encoded (i.e., the probability estimates) and the Y/N signal indicating whether the data to be encoded is or is not within that probability range indicated by the probability estimate output by the probability estimation model (i.e., whether the data is in its more probable state). With this information coder 120 outputs a string of bits representative of the symbol to be encoded, the bit string being a compressed form of the symbol.

One embodiment of the present invention is shown below in Table 1.

TABLE 1

|   | P1 0.50 ≦ P < 1.64 | | P2 0.64 ≦ P < 1 | |
|---|---|---|---|---|
| Y | 0 | S4 | — | S3 |
| N | 1 | S4 | 11 | S4 |
| Y | 0 | S4 | 0 | S4 |
| N | 10 | S4 | 10 | S4 |

Referring to Table 1, a two-state coder is shown. It should be noted that the two states are labeled S4 and S3 to be consistent with larger tables presented later. Initially, the coder is in state S4. The coder (e.g., coder 120 in FIG. 2) receives a series of probability classes (e.g., PC1, PC2, PC3, PC4, . . . ) from the probability estimation model (e.g., PEM 115 in FIG. 2) which cause the coder to output a bit sequence of zero or more bits and possibly transition to another state. The probability classes indicate to the coder which column should be used. In this example, the probability class indicates whether the coder should use column P1 or P2. For example, if the two-state coder received the sequence of probability estimates <P1, P2, P2, P2> and the sequence of Y/N decisions (Y, Y, Y, N) (i.e., likely or not) as inputs, the coder would initially receive the first input (P1) and select the first column ("0.50<P<0.64") of the first row (S4) and encounter the response "0 S4". In this case, a "0" is output and the state register remains in state S4. The second input to the coder (P2) causes the second column to be selected ("0.64≦P<1") in the first row (S4). In response, the coder does not output any bits (shown as "-") and the state register transitions to state S3 (as depicted in the column). Similarly, the third input (P2) selects the second column of the third row (S3) causing a "0" to be output and causing the state register to transition to state S4. Lastly, the fourth input (P2) causes the second column to be selected in the second row (S4), wherein a "11" is output and the state register remains in state S4. Therefore, the sequence of four probability estimates (i.e., the four decisions) produced four bits of output ("0011") even though the correspondence was not one-to-one. Though this example did not produce any compression in the number of symbols encoded, if the two-state coder received 20 consecutive cases of probability P=0.7 with 20 consecutive Y decisions, the output would have been ten "0"s, thereby providing a 2-to-1 compression.

Simple block diagrams of a coder and decoder in accordance with the present invention are illustrated in FIGS. 3a and 3b respectively. Referring to FIG. 3a, the coder includes a transition selection mechanism 200 connected to a state counter 210. The state counter 210 maintains the current state of the transition mechanism. The select transition mechanism 200 outputs zero or more bits as a compressed output based upon the input from the probability estimation model identifying the probability estimate and the Y/N response with respect to the current symbol to be encoded.

Referring to FIG. 3b, the decoder comprises state counter 230 connected to select transition mechanism 240. Select transition mechanism 240 receives as input the encoded output from a coder, via some medium or communication channel and the probability estimate generated by the probability estimation model. In response, the decoder outputs a signal indicative of the Y/N response to the question of whether the symbol to be decompressed is within the most probable range for that as indicated by that receive probability estimate.

As illustrated in FIG. 2, the Y/N response is an input to the probability estimation model (PEM) which then outputs binary decisions to the data model which, in turn, outputs the data representing the decompressed version of the input data.

The select transition mechanism may be implemented in numerous ways. For example, the mechanism may be implemented as a state machine having a plurality of logic gates which are controlled by the current state and other input data. Alternately, the select transition mechanism may be a random access memory (RAM) configured to be a look-up table wherein the output bit values and next states are elements in the table and are selected according to the current state maintained by the state counter, the probability estimate output by the statistics model and the Y/N value output by the BDM device.

FIGS. 8a-8e provide illustrations of five specific of state machine transition matrices of the present invention. For each state illustrated, the first line contains the transitions associated with the "N" decision (Unlikely), the second line contains the transitions corresponding to the "Y" decision (Likely) and the third line contains probability thresholds between neighboring transition pairs where the probability is the lower limit to the column which appears to the left of it. Each transition is described by a bit string, followed by an optional "*", followed by the name of the destination state. When the bit string is null (i.e., no bits are output), it is omitted from the present illustration. Furthermore, the destination state is omitted when the destination state is the ground state (i.e., the highest numbered state).

Referring to FIG. 8a, a two-state transition machine transition diagram is shown. Transition pairs are labeled as columns (1) and (2). If the state machine is in state S4 and the threshold (probability estimate) is greater than 0.644, the two legal transitions are stay in state S4 and output bit string "11" for a N (no) decision or transition to state S3 and do not output a bit string at all for a Y (yes) decision. If the threshold (probability estimate) is below 0.644 in state S4, the two legal transitions are stay in state S4 and output bit string "1" for a N (no) decision or stay in state S4 and output bit string "0" for a Y (yes) decision. If the state machine is in state S3, the two legal transitions are to transition to state S4 and output bit string "10" for a N (no) decision or transition to state S4 and output bit string "0" for a Y (yes) decision.

FIG. 8b, c, d, e, and f depict four-state, six state, eleven state, sixteen state and thirteen-state machines respectively. In practice, states and transitions which contribute minimally to the performance can be deleted, even if they are not strictly dominated.

Another feature of the present invention is the use of a synchronization mechanism. The synchronization mechanism inserts encoded bits into the compressed bit stream, such that partially encoded data is not interfered with. Assuming the decompressor knows when the synchronization symbols are expected, the strings "0", "0", "01" and "011" can be used in the state transition machines of FIGS. 8a, b, c, and d respectively. Alternatively, when these symbols are frequent enough to affect the bit rate, each state can have its own synchronization bit string. Thus, this makes it possible to define sequences of decisions which are guaranteed to synchronize the coder.

It should be noted that a flip-flop can be utilized with coders having large transition matrices which, when set, causes all of the output bits to be inverted. This allows the total number of states to be represented by one-half the number of states. A transition designated with "*" in FIGS. 8a-f causes the flip-flop to be toggled when encountered. Its output is fed to an exclusive-or (XOR) gate in series with the output bit stream.

TRANSITION TABLE CONSTRUCTION

Since the coder of the present invention constitutes a class of codes rather than a single code, the first step is choosing a specific code. A procedure for constructing the transition matrix implemented in the select transitions device is illustrated by FIG. 6. Referring to FIG. 6, the single most important parameter of a code is the length of the longest bit-code (N) which can be produced by the coder (or which must be handled by the decoder for a single binary decision, as shown at step 300. Setting the maximum length high improves the efficiency of the code, but increases the size of the required tables (or random-logic state machines).

After choosing a maximum bit-code length (N), knowledge of the decision probability distribution of the target application is needed. Typically, default assumptions about the distribution may be utilized. Given length (N) and the distribution, it is possible to construct an optimal code.

In constructing the optimal code, the ground state is represented as $S_N$. Given N, the ground state $S_N$ always has all possible N-bit outputs available. The states of the transition machine are then defined (step 310). In defining the transition pair for each state, each pair divides the possible outputs into two sets, such that one transition of the pair goes to a state with one or more allowable N-bit sequences and the other transition in the pair goes to a state with the remaining N-bit sequences in the set. This dividing process continues until, a transition arrives at a state having only one allowable N-bit sequence. Once in that state, the coder could output the one allowable N-bit sequence and transition (reset) to the ground state.

The number of states can be limited. In the preferred embodiment, the number of states required is reduced by outputting some bits before only one allowable sequence remains. For example, with N=4 there could be a state S8 where sequences from 0000 to 0111 were all legal outputs. Instead of creating such a state, a zero is output when state S8 would be entered, and a transition is made to state S16 where all possible four bit sequences are legal outputs. State S8 would have allowed a zero followed by all possible 3 bit sequences which then could have been followed by all possible 4 bit sequences. By outputting a zero all possible four bit sequences can be used immediately. This not only reduces the number of states, because the state S16 is needed anyway, but also improves the compression performance of the coder of the present invention because state S16 is more "efficient" than state S8 would be. The efficiency of a state is discussed later.

In the currently preferred embodiment, a set of heuristics is used to create small state tables which are efficient. For an encoder which outputs at most N bits per binary decision, a total of $2^{(N-1)}$ states are defined and named "Si" for all i with $2^{(N-1)} < i <= 2^N$. Once again, the state $2^N$ is defined to be the initial or "ground" state. Each state Si has the property that the allowable sequences are exactly those N bit sequences representing numbers from 0 to i−1. Thus the state $S2^N$ allows all N bit sequences, while the state $S2^{(N-1)}+1$ allows all sequences starting with 0 plus the one sequence which starts with 1 and has N−1 zeros.

Now, transition pairs for each state are generated (step 320). There are various procedures for generating these transition pairs. In the preferred embodiment there are heuristics which allow the generation of most transition pairs automatically. These heuristics will now be described.

In order to have a transition pair out of a state named Si, the "likely" or "yes" transition must lead to a state which allows a subset of the allowable sequences in state Si. The corresponding "no" transition must lead to a state which allows the remaining sequences. Starting in state Si, the allowable sequences range from 0 to i−1. If the "yes" transition is made to state Sj, where sequences 0 to j−1 are allowed, the "no" transition must be to a state where sequences from j to i−1 are allowed. Since the state naming heuristics only provide states where sequences from 0 to i are allowed there are no states for sequences from j to i−1. However, if the state reducing heuristic is used, one or more bits is output and transition is made to a state which allows the remaining allowable bit sequences. The complete set of rules for the preferred embodiment follow.

First consider a "yes" transition from state Si to state Sj for all j with $2^{(N-1)}+1 <= j < i$. In other words, try to assign a "yes" transition from state Si to Sj for all j less than i. Define F as the greatest common divisor (GCD) of j and $2^N$ (i.e. $F = GCD(j, 2^N)$). If $i <= j+F$ and $j+F <= 2^N$ then both the "yes" and the "no" transition have ending states which exist. The "yes" transition is:

$$Si \rightarrow Sj.$$

The No transition is defined as:

$$Si \rightarrow m, S((i-j)*2^P)$$

where P is defined as the largest integer less than or equal to $N - \log_2(i-j)$ and m is defined as the P-bit binary representation of $j*2^{(P-N)}$. In short, for each j where the inequalities involving F are satisfied, there is a valid "yes" and "no" transition pair out of state Si. Usually, there are several such valid transition pairs.

A final "yes" transition from any state Si to the ground state is always possible when following the heuristics. The "yes" transition is:

$$Si \rightarrow 0, S2^N.$$

The corresponding "no" transition is:

$$Si \rightarrow m, S((i-j)*2^P)$$

where $j=2^{(N-1)}$ and m and P are as defined previously.

These heuristics need not be followed to make a table, they just make the process easier. In addition, after following the heuristics some additional states can be defined to make more transitions possible (step 330). These states are not required but can improve efficiency. For example, if N is four a state A6 can be added. This state can be entered by adding a transition pair to state S10. The added pair is:

"yes" transition S10→A6

"no" transition S10→00,S16

State A6 has as valid outputs the six sequences from 0100 to 1001 inclusive. A state similar to A6 can be used for larger N in which case the valid sequences will begin with the four bits from 0100 to 1001 and be followed by all possible bit combinations to provide the correct length.

State A6 has at least one valid transition pair given by

"yes" transition A6→01, S16

"no" transition A6→100,S16

The preferred embodiment starts with heuristics to generate a large number of states and transitions then adds additional states to provide more transitions. FIGS. 8a, 8b, and 8c list state machines useful for binary coding which have been developed by using only the above heuristics. FIGS. 8d, 8e, 8f list state machines which have been created by using the heuristics and then adding additional states. A state machine could be created using alternative methods. In order to allow decoding it must be possible to identify the correct transition given the current state, the probability class, and the next N compressed bits. One embodiment could begin with states representing all possible sets of output sequences. In this case, any split of the set of allowable sequences into groups would form a valid transition pair. This would require $2^{2^N}$ states and is not feasible for large N.

Once some method is used to produce a state machine with several transition pairs the thresholds used for choosing a transition pair are determined and optimized (step 340). This procedure locates transition pairs which are not contributing to the effectiveness of the code. Any dominated transition pairs are removed from the transition matrix as the transitions in these states are inaccessible or ineffective, where dominated transition pairs are those which are fully encompassed within the probability classes (ranges), such that the encompassing transition pair will always be used. Note that using such a procedure to trim unnecessary states in the case where the states represent all possible sets of output sequences would be computationally intensive or impossible depending on N (where N increases).

It should be noted that the procedure defined above with reference to FIG. 6 is not limited to the specific steps described but can be extended to generate equivalent transitions. For example, an equivalent process can be performed by simply inverting the zero/one values in the emitted bits.

Once the tables have been created, it is necessary to select a probability estimation mechanism. Probability estimation can be done with a simple transition machine. For convenience and speed, the probability estimation mechanism and a bit generator (coder) can be combined into a single state machine. This can also be accomplished using software. In the currently preferred embodiment, there are two transition machines, one for the coder and one for the decoder. Each machine in the currently preferred embodiment is a lookup table.

Lastly, when the state machines are built, they are linked with the application's coder and decoder.

PROCEDURE FOR FINDING OPTIMAL THRESHOLDS

One embodiment of the procedure for determining and optimizing the threshold values for the transition pairs is illustrated by the flowcharts of FIGS. 7a and 7b. Referring to FIGS. 7a and 7b, a distribution of probability estimates typical for the type of symbol to be encoded is generated (step 360). A variety of ways well-known in the art may be used to generate the distribution of probability estimates. For example, this distribution can be determined by utilizing the upper section of the compressor to record a sequence of estimates (e.g., 500,000 estimates) and generating a probability distribution from the estimates. Alternatively, a mathematical model can be developed to describe the probability distribution. Using this model, a random sequence of "d" decisions may be generated (e.g., d=500,000).

One method for generating a distribution comprises setting the probability estimate to:

$$r = 1 + x(p - py - 0.5)$$

where x, y are uniformly distributed random variables between [0,1] and p is a parameter reflecting skew. Each random choice of x and y yield a probability r.

The procedure then comprises setting the Y/N decision equal to "Y" for the probability r; otherwise, the procedure includes setting the decision equal to "N". A parameter skew setting of P=0.0 provides a canonical distribution. A setting of P=0.1 provides a distribution skewed away from symmetric decisions/distribution.

Next, the costs of each state relative to the least expensive state is estimated (step 370). In the currently preferred embodiment, the least expensive state is the ground state, labeled $S2^N$. One possible estimate of the relative cost is $N - \log_2 M$, where M is the number of legal N-bit strings which can ultimately arise from the state. For example, M=i for state Si in the preferred embodiment. This relative cost will be referred to as "scost[i]" for the state Si. For every transition of every state, a cost "c" is determined (step 380). This can be done with the formula:

$$c = nb + scost[destination] - scost[source]$$

where nb is the number of bits output when the transition is taken, scost[destination] is the state cost of the new state, and scost[source] is the cost of the old state. Note that the cost "c" is different for the two transitions in a pair because in general each transition will output a different number of bits and end in a different state.

After determining the cost of each transition of each state, the optimal probability thresholds "t" are determined (step 390) by separating each pair of the transition pairs for each state according to the formula:

$$t = (cn1 - cn2)/(cn1 - cn2 + cy2 - cy1),$$

where cy1 and cn1 are the transition costs of the "Y" and "N" transitions respectively of one pair, and cy2 and cn2 are the transition costs of the "Y" and "N" transitions respectively of the other pair.

After determining the optimal probability thresholds, the solutions are compared to determine if they have converged (step 400). If they have converged, the process is finished. If a transition pair is dominated by one or more other transition pairs (step 410), the dominated transition pair should be deleted (step 420), as it is useless. In other words, a transition pair is not deleted until it is dominated in most of the iterations of this process.

During the first iteration of the process, the variable tcost [i] is initialized to zero. Then tcost [i] is updated (step 440) according to:

$$tcost[i] = tcost[i] + c/n$$

for all states Si. For all elements i, the scost [i] array is updated (step 450) to be:

$$scost[i] = tcost[i] - tcost[\text{ground state}].$$

Thus, an iteration of the procedure is performed through the d elements of the sample distribution chosen at step 360, determining the costs c of each transition associated with each state i and the decision (r,t) produced as described above. The steps 380, 390, 400, 410, 420, 430, 440 and 450 may be repeated a multiplicity of times to ensure that the solution has converged and an optimum transition matrix has been created.

Tables created by the present invention are shown in FIGS. 8a-e. The transition pairs are labeled by a number ranging from 1-8 in FIGS. 8a-c and 8e. In particular, FIG. 8a was produced by following the procedure of FIGS. 6, 7a and 7b for N=2. FIG. 8b was generated by following the process for N=3. FIG. 8c was produced by following the procedure for N=4 and removing states S13 and S9 in accordance with the optional step 340, FIG. 6. FIG. 8d is shown in a slightly different format. Each column is identified by a probability, such that the probability is the same for the transition pairs of all of the states in that particular column. Furthermore, as all of the other tables are shown with two rows for each state ordered such that the row associated with the "No" transition is first and the "Yes" transition row is second, this convention is reversed for FIG. 8d. Thus, in the case of FIG. 8d, the row corresponding to a "Yes" decision is first, positioned adjacent to the name of the state in the state column of the matrix, while the row corresponding to a "No" decision is below the row for "Yes" decisions. FIG. 8d is a modified matrix in which states B12 and B10 are added to the matrix in accordance with the instructions as set forth in step 340, FIG. 6. The new transitions and resulting optimal thresholds are shown in the updated matrix of FIG. 8d. FIG. 8e follows the procedure for N=4. It should be noted that in practice, states or transitions should be removed when they contribute minimally to the performance even though they are not strictly dominated (i.e., inaccessible).

HARDWARE IMPLEMENTATION

An example of a coder is illustrated by FIGS. 4a and 4b. The coder shown in FIG. 4a implements the code shown in FIG. 8b. FIG. 4a shows a circuit comprising logical components which receive as input the Y/N signal (UNLIKELY) and a probability from the probability estimation model, identified in FIG. 4a as +PE and +PH. The compressed data is output over one, two or three code lines identified in FIG. 4a as CODE BIT 0, CODE BIT 1 and CODE BIT 2. Furthermore, data is output on signal lines LENGTH_MSB and LENGTH_LSB which reflect the length of the output bit string by indicating which of code bits 0-2 are to be used. The table of FIG. 4b corresponds to the logic diagram of FIG. 4a and shows the different input value states, UNLIKELY, PE, PH, and the corresponding probability ranges MINPROB, MAXPROB, maintained by the statistics model and implemented by the coder of FIG. 4a to generate the compressed bit stream output.

Referring to FIG. 4a, the UNLIKELY input is coupled to the input of buffer 403. The output of buffer 403 is the CODE BIT 0 output. The UNLIKELY input is also coupled to one of the inputs of NOR gate 402 and one of the inputs of inverter 401. The other input of NOR gate 402 is coupled to one of the inputs of AND gate 404. The other input of AND gate 404 is coupled to the Q output of J-K flip-flop 406. The J input of flip-flop 406 is tied high (i.e., active). The K input of flip-flop 406 is coupled to the output of AND gate 405. The inputs of AND gate 405 are coupled the output of inverter 401 and the probability estimates +PE and +PH. Flip-flop 406 is clocked by CLK clock signal. The output of AND gate 404 is coupled to the input of OR gate 413.

The other input of OR gate 413 is coupled to the output of AND gate 411. The inputs of AND gate 411 are coupled the $\overline{Q}$ output of flip-flop 406 and the output of XNOR gate 407. The inputs of XNOR gate 407 are coupled to the output of inverter 401 and the +PH probability estimate. The output of OR gate 413 is coupled to the K input of J-K flip-flop 416. The J input of flip-flop 416 is coupled to the output of NAND gate 412. The inputs of NAND gate 412 are coupled to the Q output of flip-flop 406 and the output of AND 405. Flip-flop 416 is clocked by the CLK clock signal. The Q output of flip-flop 416 is the CODE BIT 1 output. The $\overline{Q}$ output of flip-flop 416 is coupled to one of the inputs to OR gate 420. The other inputs to OR gate 420 are the +PH probability estimate and the output of NOR gate 414. The inputs of NOR gate 414 are coupled to the +PE probability estimate and the $\overline{Q}$ output of flip-flop 406. The output of OR gate 420 is coupled to one of the inputs to AND gate 421. The other input of AND gate 421 is coupled to the output of buffer 403. The output of AND gate 421 is the LENGTH_MSB.

The output of AND gate 421 is also coupled to one of the inputs to XOR gate 422. The other input of XOR 422 is coupled to the output of NOR gate 419. The output of XOR gate 422 is the LENGTH_LSB output. One of the inputs to NOR gate 419 is coupled to the output of AND gate 415. The inputs of AND gate 415 are the output of AND gate 404 and the Q output of J-K flip-flop 416. Another input of NOR gate 419 is coupled to the output of AND gate 417. One of the inputs of AND gate 417 is coupled to the $\overline{Q}$ output of flip-flop 406. The other input of AND gate 417 is coupled to the output of OR gate 418. The inputs of OR gate 418 are coupled to the outputs of AND gate 408 and gate 409. The inputs of AND gate 408 are coupled to the inverted Q output of flip-flop 416 and the inverted output of inverter 401 (i.e., non-inverted UNLIKELY signal). The inputs of AND gate 409 are coupled to the Q output of flip-flop 416 and the +PH probability estimate.

The other input to NOR gate 419 is coupled to the output of AND gate 418. The inputs of AND gate 418 are coupled to the Q output of flip-flop 406, the +PH probability estimate and the +PE probability estimate.

As stated previously the coder of FIG. 4c implements the code shown in FIG. 8b. The two flip-flops 406 and 416 are used to store the state variable. As shown below, the state variable is either S8, S7, S6 or S5. The "J" input of flip-flop 406 is tied active. This is because the odd states (S5 and S7) stay active for only a single cycle. Table 2 below illustrates the coder table with the transition pair chosen for each combination of the probability estimates PE and PH.

TABLE 2

| Probability Estimate: | | | | | | |
|---|---|---|---|---|---|---|
| PE | | 1 | 0 | 0 | 1 | |
| PH | | 1 | 1 | 0 | 0 | |
| State: F-F 406/F-F 416 | | | | | | |
| On | On | "S8" | | | | |
| | | Unlikely=1: | 111 | 11 | 11 | 1 |
| | | Unlikely=0: | S7 | S6 | S6 | 0 |
| Off | On | "S7" | | | | |
| | | Unlikely=1: | 110 | 110 | 1,S6 | 1,S6 |
| | | Unlikely=0: | S6 | S6 | 0 | 0 |
| On | Off | "S6" | | | | |
| | | Unlikely=1: | 101 | 10 | 10 | 10 |
| | | Unlikely=0: | S5 | 0 | 0 | 0 |
| Off | Off | "S5" | | | | |
| | | Unlikely=1: | 100 | 100 | 100 | 100 |
| | | Unlikely-0: | 0 | 0 | 0 | 0 |

The circuit in FIG. 4a continuously responds to the probability presented on the inputs, producing a code output of length 0, 1, 2, or 3 bits as shown in Table 3 below:

TABLE 3

| LENGTH_MSB | LENGTH_LSB | CODE OUTPUT |
|---|---|---|
| 0 | 0 | none |
| 0 | 1 | BIT_0 |
| 1 | 0 | BIT_0 BIT_1 |
| 1 | 1 | BIT_0 BIT_1 BIT_2 |

When the subsequent circuitry has used the output of this circuitry, a transition is caused on the CLK signal to update flip-flops 406 and 416 to the required new state.

The circuit in FIG. 4a does not provide any special reset. Flip-flops 406 and 416 can be put into the correct reset state (S8 or both flip-flops ON) by any transition of the CLK signal while UNLIKELY and PH are low and PE is high.

FIG. 5 illustrates another embodiment of a coder and decoder implemented in accordance with the present invention. In this embodiment, two memories are used to store two look-up tables (e.g., transition state machine, transition tables) utilized in the coding and decoding process respectively (referred to in FIG. 5 as ROM 300 and 310 respectively). These memories are used to select the transitions and control the compression and decompression of data. Referring to FIG. 5, the Y/N decision 315, probability 320 from the statistics model (FIG. 2) and the state of the coder 325, as maintained by the state register 330, are input to the ROM 300 to select the proper output consisting of the compressed data bit stream and an identification of the next state. For decompression, the compressed data from data register 370, the probability 320 and the state of the coder are input as indices to the look-up table in ROM 310 which, in response, outputs the Y/N decision 380 and the identification of the next state.

As this circuit performs both compression and decompression, a compression enable signal line 335 and decompression enable signal line 340 are utilized to select the functionality of the circuit. Thus, when the circuit is to perform compression, compression enable line 335 is actuated to enable the ROM 300 and when decompression is to be performed the decompression enable line 340 is activated to enable ROM 310.

During the compression sequence, ROM 300 receives the Y/N value 315, probability 320 and state register state 325 and outputs the new state 350 which is then stored in the state register 330, a count of the number of bits output as compressed data 355 and the compressed data 360. The compressed data 360 is stored in the data register 370 and the count of bits 355 output by the ROM is used to shift the bits into the data register to receive the compressed data bits output by ROM 300. The compressed data then may then be output to a storage or transmission medium through the data register 370 when desired.

When data is to be decompressed, the data is placed in the data register 370 and read out of the data register as controlled by the shift count signal line 375 and input to the ROM 320 along with the probability 320 and state as maintained by the state register 330. These input values are used to perform a table look-up in the table located in the ROM 310, which outputs Y/N value 380 identifying to the statistics model whether the data value falls within the more probable range. ROM 310 also outputs the number of compressed data bits which is input to the shift count line 375 of the data register 370 to shift the bits located in the data register 370 and the next state 350 of the circuit. As described previously, the Y/N signal generated is input to the remaining components of the decompressor, specifically the statistics model and BDM device, to reconstruct the input data.

While the invention has been described in conjunction with preferred embodiments, it is evident that numerous alternatives, modifications, variations and uses will be apparent to those skilled in the art in light of the foregoing description.

Thus, a method and apparatus for generating a bit stream has been described.

I claim:

1. A method of generating a code bit stream from at least one input token and a probability value and a yes/no indicative associated with said at least one input token, said method comprising the steps of:

providing a transition machine having a plurality of states, wherein each of said states has at least one transition pair, wherein said at least one transition pair is chosen according to a predetermined threshold value and each of said transitions in said at least one transition pair is associated with a bit stream and is chosen according to a predetermined yes/no indicative, said transition machine initialized to a current state;

searching said at least one transition pair in said current state of said transition machine according to said probability value;

outputting the bit stream associated with said transition and transitioning to the next state according to said yes/no indicative, such that upon searching for the next of said probability values begins by searching transition pairs in said next state.

2. The method as defined in claim 1 wherein said step of providing comprises the steps of:
choosing the maximum bit stream length;
defining the states of said transition machine; and
generating the transition pairs of each of said states.

3. The method defined in claim 2 further comprising the step of optimizing the thresholds of each of the transition pairs in said transition machine.

4. The method as defined in claim 2 further including the step of adding at least one additional state after generating said transition pairs, wherein said at least one additional state refines said transition machine.

5. The method as defined in claim 4 wherein said at least one additional state has transitions which return to a previously generated state.

6. The method as defined in claim 3 wherein the step of optimizing thresholds includes the steps of:
(a) generating a distribution of probability estimates;
(b) estimating the cost of each state relative to the least expensive state;
(c) generating the optimal probability thresholds;
(d) determining whether the optimal probability thresholds converge, such that if the optimal probability thresholds converge then the thresholds are optimized and if the optimal probability thresholds do not converge then updating said thresholds and repeating steps (a)–(d).

7. The method as defined in claim 1 further comprising the step of inverting a portion of the output bit stream.

8. The method as defined in claim 7 wherein said step of inverting comprises the step of toggling an XOR gate on said bit stream.

9. An apparatus for generating a code bit stream from at least one input token and a probability value and a yes/no indicative associated with said at least one input token, said apparatus comprising:
a transition machine having a plurality of states, wherein each of said states has a plurality of transition pairs, wherein each of said pairs is chosen according to a predetermined threshold value and each of said transitions in each of said transition pairs is associated with a bit stream and is chosen according to a predetermined yes/no indicative, said transition machine initialized to a current state;
means for searching said transition pairs in said current state of said transition machine according to said probability value;
means for outputting the bit stream associated with said transition and transitioning to the next state according to said said yes/no indicative, such that upon searching for the next of said probability values begins by searching transition pairs in said next state.

10. The apparatus as defined in claim 9 wherein said transition machine comprises a ROM.

11. A decoder for decoding a compressed bit stream in order to reconstruct an uncompressed data, said decoder comprising:
input means for receiving the compressed bit stream;
state means which identifies the state of the decoder, said state means initialized to be at a predetermined ground state;
a select transition mechanism for selecting the next state of the decoder and a yes/no value indicative of whether data to be reconstructed is within the range of probabilities identified by a probability value; said select transition mechanism comprising a transition matrix comprising zero or more transition pairs of elements for each state, each element of each transition pair comprising the yes/no value and the identification of the next state provided to the state means, such that the yes/no value is provided to the modeling means for reconstructing the uncompressed data.

12. A method for decoding a compressed bit stream in order to reconstruct an uncompressed data, said method compressing steps of:
receiving the compressed bit stream;
searching a transition machine having a plurality of states, wherein each of said states has at least one transition pair, wherein said at least one transition pair chosen according to a predetermined threshold value an each of said transitions in said at least one transition pair is associated with a bit stream and is chosen according to a predetermined yes/no indicative, said transition machine initialized to a current state, said step of searching including searching said at least one transition pair according to said probability value;
outputting the uncompressed bit stream associated with said transition and transitioning to the next state according to said yes/no indicative, such that upon searching for the next of said probability values begins by searching in said next state.

13. A system for the compression of input data comprising a modeling means for characterizing the input data as a probability value that specifies a range of probabilities of occurrence and a yes/no indicative that the input data is within the range specificed by the probability value; a coder for generating a stream of bits representative of the compressed form of the input data including:
input means for receiving a probability value and a yes/no value indicative that the input data is within the range specified by the probability value;
state means which identifies the state of the decoder, said state means initialized to be at a predetermined ground state;
a select transition mechanism for selecting the next state of the decoder and zero or more bits as output data to be part of the stream of bits representative of the compressed form of the input data, said select transition mechanism receiving the identification of the state of the decoder from the state means and the probability value and yes/no value indicative that the input data is within the range specified by the probability value; said select transition mechanism comprising a transition matrix comprising zero or more transition pairs of elements for each state, each element of each transition pair comprising zero or more bits as output data and the identification of the next state provided to the state means, such that a compressed data stream representative of the input data is generated and output.

14. The system for the compression of input data as set forth in claim 13, further comprising a decoder for decoding a compressed bit stream in order reconstruct the uncompressed data, said decoder including:
input means for receiving the compressed bit stream;
state means which identifies the state of the decoder, said state means initialized to be at a predetermined ground state;
a select transition mechanism for selecting the next state of the decoder and a yes/no value indicative of whether data to be reconstructed is within the range of probabilities identified by a probability value; said select transition mechanism comprising a transition matrix comprising zero or more transition pairs of elements for each state, each element of each transition pair comprising the yes/no value and the identification of the next state provided to the state means, such that the yes/no value is provided to the modeling means for reconstructing the uncompressed data.

15. In a system for the compression of input data comprising a modeling means for characterizing the input data as a probability value which specifies a range of probabilities of occurrence and a yes/no indicative that the input data is within the range specified by the probability value, a process for generating a stream of bits representative of the compressed form of the input data including:

receiving a probability value and a yes/no value indicative that the input data is within the range specified by the probability value;

identifying the state of the process, said state initialized to be at a predetermined ground state;

selecting the next state of the decoder and zero or more bits as output data to be part of the stream of bits representative of the compressed form of the input data, the next state bits selected based upon the identification of the state of the process and the probability value and yes/no value indicative that the input data is within the range specified by the probability value; said step of selecting comprising the steps of;

providing a transition matrix comprising zero or more transition pairs of elements for each state, each element of each transition pair comprising zero or more bits as output data and the identification of the next state provided to the state means, such that a compressed data stream representative of the input data is generated and output.

16. A method for generating a transition machine comprising the steps of:

choosing the maximum bit stream length N;

providing the states of the transition machine, wherein the ground state is named as $S(2^N)$;

generating the transition pairs of each of the states, wherein the possible outputs are divided into a first portion and second portion, such that each transition in a pair goes to a state with one or more allowable N bit sequences and the other transition in the pair goes to the remaining allowable N bit sequences, wherein when a transition leads to a state having only one allowable N bit sequence, the sequence constitutes the output of the sequence and the state transition to the ground state, such that all of the transition pairs are defined.

17. The method as defined in claim 16 further comprising the step of optimizing the thresholds of each of the transition pairs in said transition machine.

18. The method as defined in claim 16 further comprising the step of adding at least one additional state after generating said transition pairs, wherein said at least one additional state refines the transition machine.

19. The method as defined in claim 17 wherein:
(a) generating a distribution of probability estimates;
(b) estimating the cost of each state relative to the least expensive state;
(c) generating the optimal probability thresholds;
(d) determining whether the optimal probability thresholds converge, such that if the optimal probability thresholds converge then the thresholds are optimized and if the optimal probability thresholds do not converge then deleting said thresholds and repeating steps (a)–(d).

* * * * *